United States Patent
Poddar et al.

(10) Patent No.: US 6,465,890 B1
(45) Date of Patent: Oct. 15, 2002

(54) INTEGRATED CIRCUIT PACKAGE HAVING OFFSET SEGMENTATION OF PACKAGE POWER AND/OR GROUND PLANES AND METHODS FOR REDUCING DELAMINATION IN INTEGRATED CIRCUIT PACKAGES

(75) Inventors: Anindya Poddar, Sunnyvale, CA (US); Ka Heng The, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/724,610

(22) Filed: Nov. 28, 2000

(51) Int. Cl.[7] ............................................. H01L 23/48
(52) U.S. Cl. ..................... 257/773; 257/706; 257/710; 257/712
(58) Field of Search .............................. 257/773, 706, 257/710, 712, 691, 698; 361/704

(56) References Cited

U.S. PATENT DOCUMENTS

| | | | |
|---|---|---|---|
| 4,924,291 A | * 5/1990 | Lesk et al. .................. 257/669 |
| 5,639,989 A | * 6/1997 | Higgins, III ........... 174/35 MS |
| 5,672,911 A | * 9/1997 | Patil et al. .................. 257/691 |
| 5,844,168 A | * 12/1998 | Schueller et al. .......... 174/52.4 |
| 6,160,705 A | * 12/2000 | Stearns et al. .............. 174/252 |

* cited by examiner

Primary Examiner—Richard Elms
Assistant Examiner—Douglas Menz
(74) Attorney, Agent, or Firm—Beyer Weaver & Thomas LLP

(57) ABSTRACT

Integrated circuit packages having offset segmentation, or splitting, of package power and/or ground layers and methods for preventing delamination in package substrates having segmented power and/or ground layers are described. The package substrate includes a plurality of split power and/or ground plane layers that are isolated by split lines. The split lines from at least two of the split power and/or ground plane layers are offset relative to one another. In some embodiments, in addition to being offset, the split lines may be arranged to minimize their respective cross-over points, as well as convoluted to increase their effective length.

9 Claims, 6 Drawing Sheets

INTEGRATED CIRCUIT PACKAGE HAVING OFFSET SEGMENTATION OF PACKAGE POWER AND/OR GROUND PLANES AND METHODS FOR REDUCING DELAMINATION IN INTEGRATED CIRCUIT PACKAGES

FIELD OF THE INVENTION

The present invention relates generally to integrated circuit packages. More specifically, the present invention relates to integrated circuit packages having multi-layered laminated substrates including conductive layers that are segmented by split lines.

BACKGROUND OF THE INVENTION

Current advances in the design of integrated circuit dice have resulted in dice having increased circuit density, functionality, and speed. To effectively utilize these advances, integrated circuit packaging has developed to provide greater external contact density for the die and to reduce noise generated from the high density of electrical paths in the package.

One type of integrated circuit package that is frequently used in packaging the high performance dice is a grid array-type package, such as pin grid array and ball grid array packages. In some implementations, a multi-layer laminate substrate is used to support the die. The substrate is generally formed of electrically conductive layers, such as copper foil, interleaved with electrically insulating layers, such as prepreg layers formed of bizmaleimide trazine (BT) resin materials. Examples of conductive layers include signal/trace layers, power plane layers, and ground plane layers. Typically, the outermost layers of the substrate, such as the top and/or bottom surfaces of the substrate, contain the signal/trace layers and the power and/or ground layers are located between the top and bottom surfaces.

The layers are generally adhered together by an epoxy resin or an adhesive sheet, such as prepreg. Frequently, a resist is also coated on a surface of the internally located layers to flatten the surface and enhance the adhesion between the layers. Pressure and heat are then applied to the multi-layered structure to effect the lamination.

Vias are then drilled, or laser ablated, in the substrate and plated to form conductors for electrical connections between the various conductive layers. The number of electrically insulating layers, conductive layers and vias depends upon the integrated circuit die to be packaged.

Contact lands are formed on selected portions of the traces on the outermost conductive layer of the substrate. These contact lands are connected to associated bond pads of the die by conductive traces, conductive vias and bond wires. Contacts, such as solder balls, are formed on the contact lands, and allow interconnection of the package to another substrate, such as a printed circuit board.

Some high performance dice may be designed with a variety of circuits that may require different power supplies. Frequently, when more than three power supplies are used, the power plane layers of the package may be split into segments which support different power levels on the same power plane layer. Each of the segments are divided by split lines that isolate each of the different segments and prevent electrical interconnection of the segments. Typically, split lines are formed by creating areas where no conductive material is present, for example, by etching away portions of the conductive layer to form a non-conductive split line. Frequently, the ground plane layers of the substrate are also similarly split into separate segments that vertically align with the power plane segments in the substrate.

For example, mixed signal dice, include both analog and digital circuits. Often these dice are designed with all or most of the analog functionality on one side of the die with the remaining sides having the digital functionality. When designing the packages for these dice, frequently, some of the power and ground layers of the substrate are split into segments that support analog or digital circuitry.

FIG. 1 is a generalized diagrammatic illustration of a top view of a power or ground plane layer of an integrated circuit package substrate showing a division of the layer into segments supporting different power requirements. As illustrated, the layer 100 may be divided into 3 segments supporting different circuitry of the die. For example, in supporting a die having both digital and analog circuitry, the layer 100 may be a power plane layer divided into two segments supporting different digital powered circuitry and one segment supporting analog circuitry. For example, segments 102 and 104 may support digital circuitry requiring 3.3 V and 2.5 V, respectively; and segment 106 may support analog powered circuitry. The layer 100 may also be a ground plane layer similarly divided into separate segments that provide ground to the respective circuits of the die.

FIG. 2 is a diagrammatic illustration of conventionally formed split lines in the power and ground plane layers of a laminated substrate. In the illustration, the conductive layers 202, 212 and 222 are shown in relative alignment to each other when laminated in the substrate. It will be appreciated that the layers may be power or ground plane layers that may be differently ordered and that a greater or lesser number of each of the layers may be present in some substrates. Further, as earlier described, electrically isolating layers are typically located between the conductive layers in a laminated substrate.

Conductive layer 202 may be a ground plane layer having split lines 210 which divide it into electrically isolated segments. For example, segments 204, 206 may serve as ground to differently powered digital circuitry and segment 208 may serve as ground to analog circuitry. As earlier described, typically, the split lines 204 are formed by creating areas where no conductive material is present, and isolate each of the segments 204, 206, and 208 from the others.

Conductive layer 212 may be a power plane having similarly formed split lines 220 which divide it into corresponding segments which support different power requirements of the die. For example, segment 214 may conduct power of 3.3 V to digital circuitry; segment 216 may conduct power of 2.5 V to digital circuitry; and, segment 218 may serve as sub-ground to analog circuitry.

Conductive layer 222 may be also be a power plane having similarly formed split lines 230 which divide it into corresponding segments which support different power requirements of the die. For example, segment 224 may conduct power of 3.3 V to digital circuitry; segment 226 may conduct power of 2.5 V to digital circuitry; and, segment 228 may conduct power to analog circuitry.

Conventionally, the split lines 210, 220, and 230 are similarly formed in a substantially linear pattern and are located on each layer so that when the various layers of the substrate are stacked and laminated together, each of the split lines substantially align over one another and match in pattern.

During the lamination process, it is not possible to apply pressure uniformly across the entire substrate due to the absence of material in the split lines, and, thus, the split lines are weak links for delamination due to their substantially same patterning and direct overlaid alignment in the stacked substrate. A current problem observed in laminated package substrates having segmented layers, e.g., layers with split lines, is points of delamination corresponding to the location of the split lines. These delaminations result in defective packages and reduced yield.

Consequently, there is a need for reducing delaminations in laminated package substrates having split conductive layers.

SUMMARY OF THE INVENTION

To achieve the foregoing, and in accordance with the purpose of the present invention, there are described integrated circuit packages having offset segmentation, or splitting, of package power and/or ground layers and methods for preventing delamination in package substrates having segmented power and/or ground layers.

According to one embodiment, there is described a substrate for use in an integrated circuit package. The substrate includes a plurality of split power and/or ground plane layers that are isolated by split lines. The split lines from at least two of the split power and/or ground plane layers are offset relative to one another. This serves to reduce the probability of delaminations of the substrate. In a preferred embodiment of the invention, the split lines are arranged to minimize their respective cross-over points.

In a further embodiment, the substrate is included in an integrated circuit package having a die conductively attached to the substrate, and an encapsulant.

According to another embodiment, there is described a method for forming split lines on power and/or ground plane layers in a multi-layer laminated package substrate so as to reduce delaminations in the package substrate along the split.

BRIEF DESCRIPTION OF THE DRAWINGS

The present invention may best be understood by reference to the following description taken in conjunction with the accompanying drawings in which.

DETAILED DESCRIPTION OF THE INVENTION

According to the present invention, there are described integrated circuit packages having offset segmentation of conductive layers and methods for reducing delamination in integrated circuit packages having segmented conductive layers.

The present invention describes various structures and methods for reducing delamination along the split lines of segmented conductive layers by offsetting the split lines of the different conductive layers so as to minimize cross-over points of the split lines. Further, the split lines may be patterned so that the offset minimizes the area of the intersection at the cross-over point by patterning the split lines so that the split lines cross-over one another at near ninety degrees. Additionally, the split lines may be convoluted to increase the effective length of the split lines.

Figure 1:
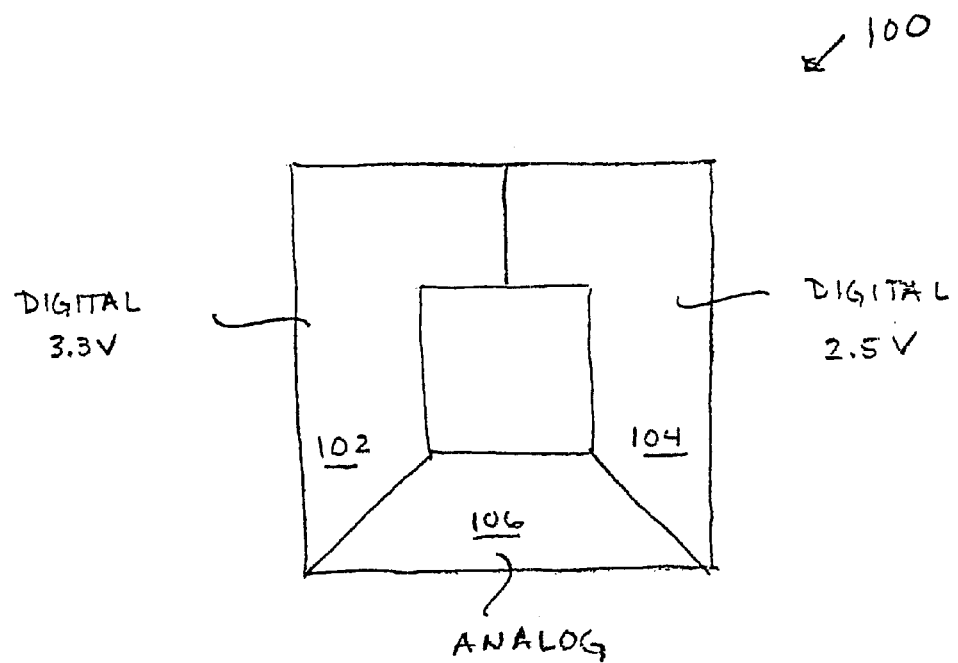
FIG. 1 is a generalized diagrammatic illustration of a top view of a power or ground plane layer of an integrated circuit package substrate showing a division of the layer into segments supporting different power requirements.
Figure 2:
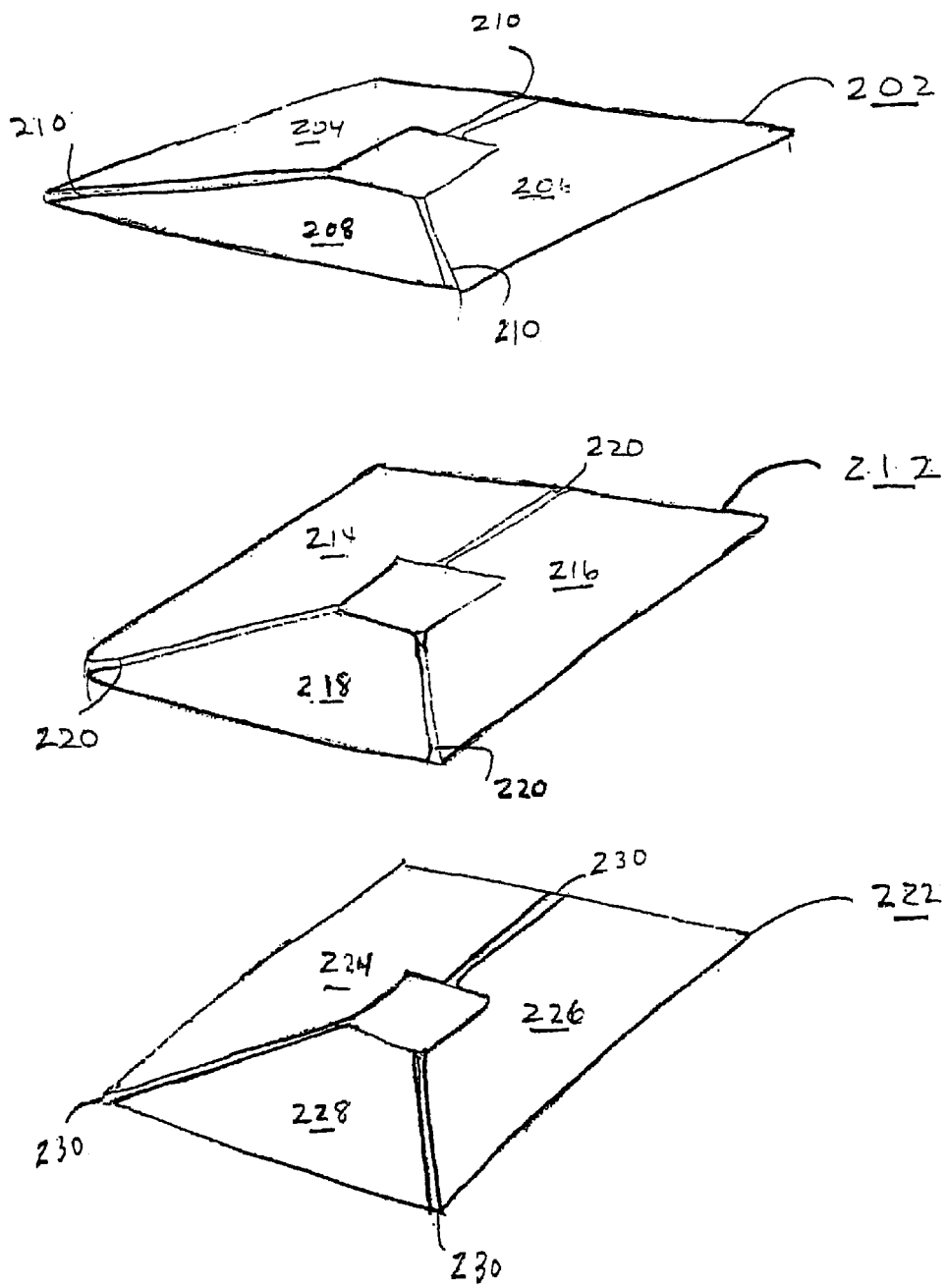
FIG. 2 is a diagrammatic illustration of conventionally formed split lines in the power and ground plane layers of a laminated substrate.
Figure 3:
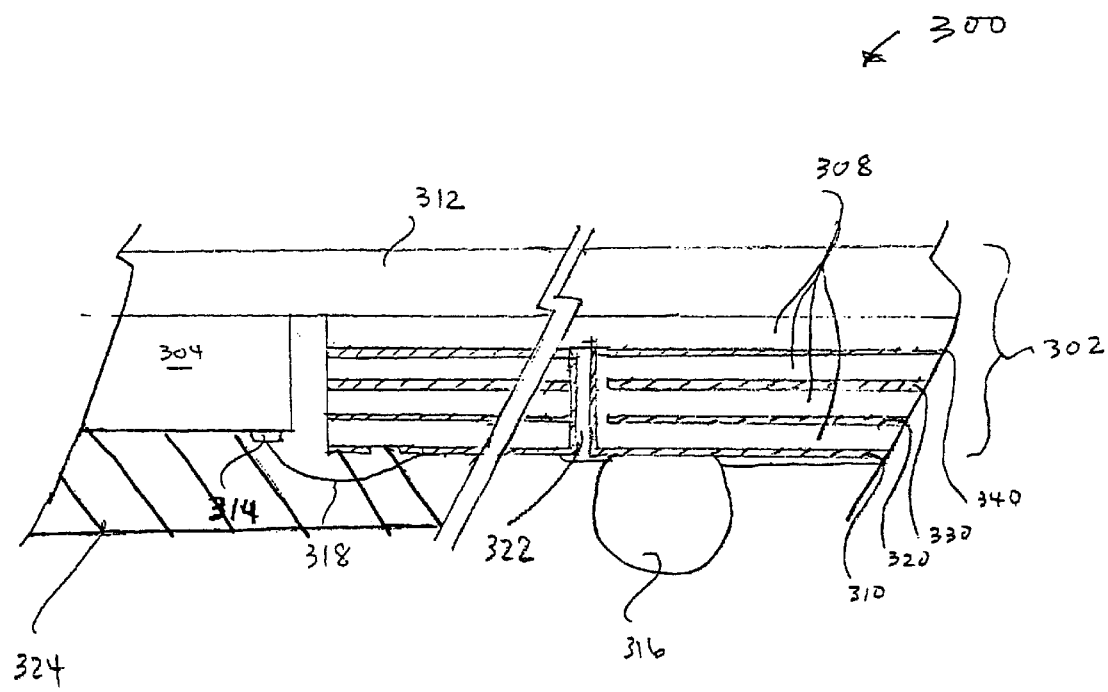
FIG. 3 is a diagrammatic illustration of a portion of a cross-sectional view of a cavity down ball grid array package having a multi-layer substrate in which the power and ground plane layers are split into segments according to one embodiment of the present invention.

FIG. 3 is a diagrammatic illustration of a portion of a cross-sectional view of a cavity down ball grid array package having a multi-layer substrate in which the power and ground plane layers are split into segments according to one embodiment of the present invention. As illustrated, package 300 includes a substrate 302 having a die 304 mounted in a cavity in the substrate. The substrate 302 includes electrically conductive layers 310, 320, 330, and 340 separated by electrically insulating layers 308. The substrate 302 may further include a heat dissipating layer 312, such as a copper slug. The die 304 may be attached to the heat dissipating layer 312 using an adhesive which permits thermal conductance from the die 304 to the heat dissipating layer 312. Layer 310 may serve as a signal/trace layer where layers 320, 330, and 340 may serve as power or ground plane layers The bond pads 314 of the die 304 are connected to layer 310 of the substrate 302 by wire bonds 318. The wire bonds 318 are connected to bond rings/fingers formed in layer 310 which are trace routed to associated contacts 316 overlying contact lands formed in the layer 310. Conductive vias 322 formed through the substrate 302 selectively interconnect conductive layers 310, 320 and 330 to the die 304 and the contacts 316. An encapsulant 324 is molded over the die 304 and the wire bonds 318.

It will be appreciated that while the present embodiment is described in terms of a cavity down ball grid array package, the present invention may also be embodied in non-cavity packages as well as other types of packages such as pin grid array packages, multi-tiered cavity packages, and other package substrates having multiple laminated layers.

Figure 4:
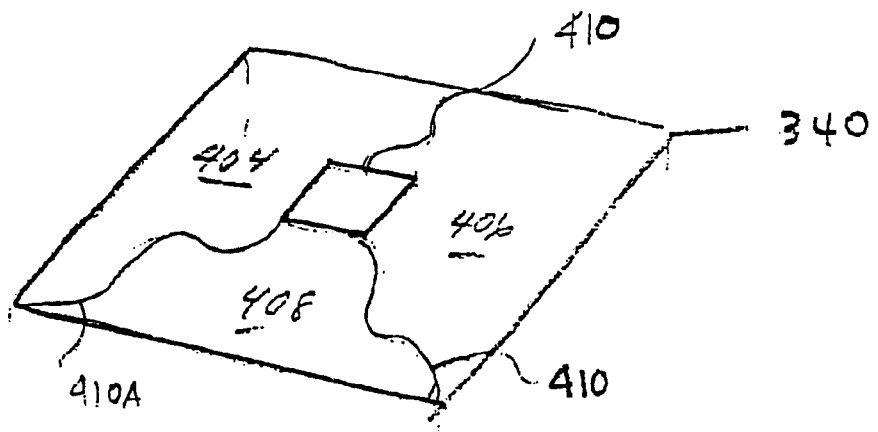
FIG. 4 is a diagrammatic illustration of the power and ground layers of the package of FIG. 3 having offset split lines according one embodiment of the present invention.
Figure 4:
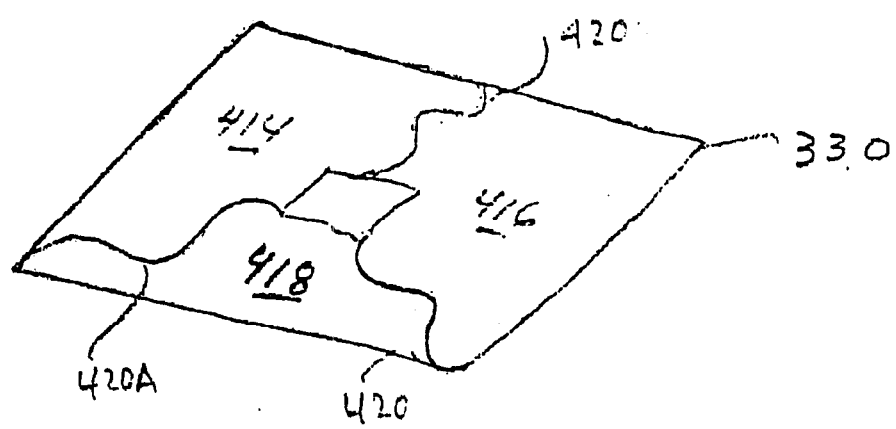
Figure 4:
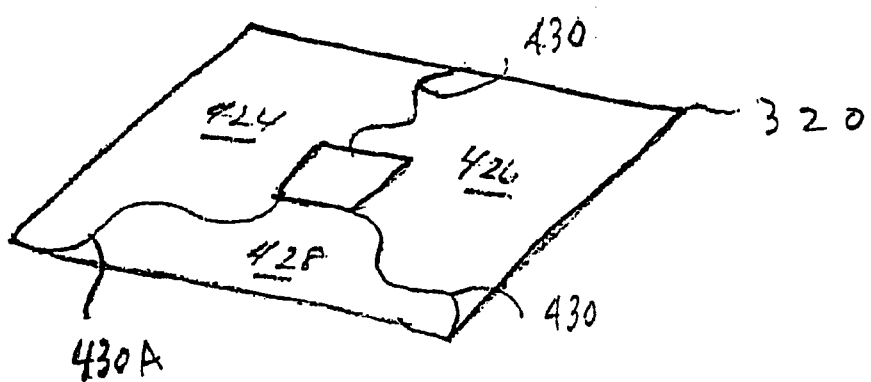

FIG. 4 is a diagrammatic illustration of the power and ground layers of the package of FIG. 3 having offset split lines according one embodiment of the present invention. For ease of description, only the power and ground plane layers of the package device are illustrated. In one embodiment, layers 320, 330, and 340 may be power or ground plane layers that are segmented using split lines formed according to the present invention as further described herein.

The conductive layers 320, 330, and 340 may be substantially aligned in the substrate so that each segment is referenced to corresponding segments in another layer. For example, segments 404, 414 and 424 may reference each other; segments 406, 416 and 426 may reference each other; and, segments 408, 418 and 428 may reference each other.

In one embodiment, the split lines may be formed by removing conductive material from the conductive layer according to a pattern, for example, by etching; however, it will be appreciated that other methods may be used to form split lines which electrically isolate each of the segments on a layer. In the present embodiment, the split lines 410 are differently patterned from split lines 420, and split lines 420 are differently patterned from split lines 430 to reduce the number of cross-over points of the split lines in the substrate. When the layers are stacked in the substrate, this minimizes the areas in the substrate along the split lines where no conductive material is present. Additionally, the split lines 410, 420, and 430 may also be convoluted, rather than linear as is the conventional practice. Convoluting the split lines 410, 420 and 430 increases the overall effective length of the split lines over that of linearly formed split lines and may provide improved adhesion during the lamination process and reduced delaminations during subsequent exposure to moisture from accelerated reliability testing and from the surrounding environment.

Although the present illustration shows each split line of a layer similarly patterned, other embodiments in which the split lines are each differently patterned or in which the split lines are a combination of same and different patterns may be used. In these cases, it is preferred that the underlying or overlying "adjacent" split line be offset according to the present invention to minimize cross-over points.

Figure 5:
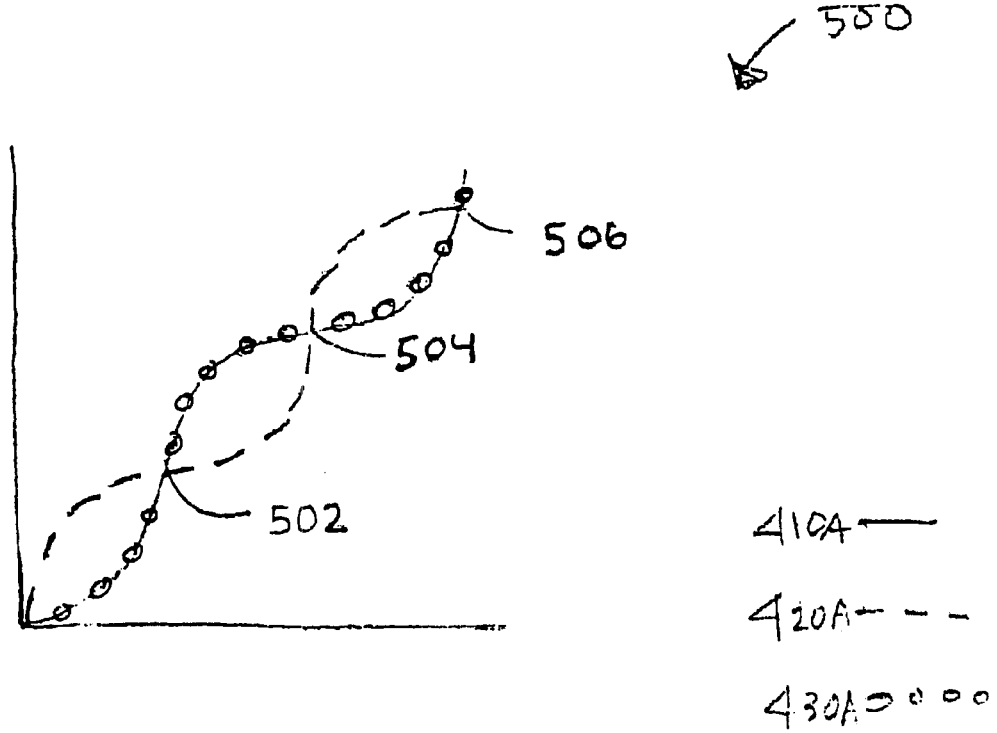
FIG. 5 is a diagrammatic illustration of a top view of an overlay of the split lines 410A, 420A, and 430A earlier described with reference to FIG. 4 according to one embodiment of the present invention.

FIG. 5 is a diagrammatic illustration of a top view of an overlay of the split lines 410A, 420A, and 430A earlier described with reference to FIG. 4 according to one embodiment of the present invention. In the overlay 500, the points 502, 504 and 506 indicate cross-over points of the patterns of the split lines 410A, 420A and 430A in the substrate. Although split lines 410A and 430A are similarly patterned, they are not vertically "adjacent" to each other in the substrate, as split line 420A is present between them. By offsetting the split line patterns in vertically "adjacent" layers, cross-over points of the split lines in the substrate are reduced over prior art methods in which split lines were substantially aligned directly over another and vertically "adjacent" which resulted in voids which were vertically "stacked" upon each other in the substrate.

It will be appreciated by those skilled in the art that the quoted terms "adjacent", "intersection", and "stacked", in the context of the present invention, are used in describing the conductive layers with the understanding that in a laminated substrate, the conductive layers are typically separated by electrically insulating layers. Thus, use of these terms comes with the understanding that other layers, such as the electrically insulating layers, may be present between the conductive layers, and does not require that the conductive layers be immediately adjacent and in direct contact with each other, nor that the intersection of the split lines be formed through direct contact.

In the present embodiment, the split lines 410A, 420A and 430A have cross-over points where the split lines "intersect" at near ninety degrees to each other. Cross-over points with "intersections" near ninety degrees tend to provide better delamination results than those having "intersections" of greater than ninety degrees.

Figure 6:
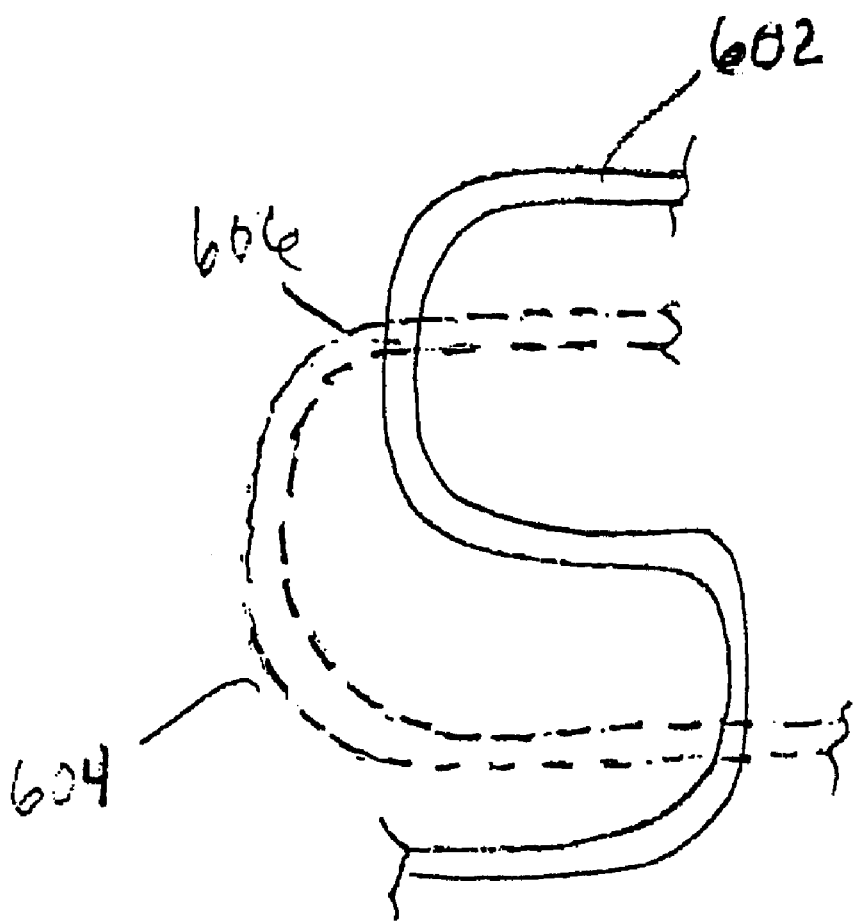
FIG. 6 is an diagrammatic illustration of an overlay of a cross-over point of two split lines illustrating a near ninety degree "intersection" according to one embodiment of the present invention.

FIG. 6 is a diagrammatic illustration of an overlay of a cross-over point of two split lines illustrating a near ninety degree "intersection" according to one embodiment of the present invention. As illustrated, split lines 602 and 604 "intersect" each other at the cross-over point 606 at a near ninety degree angle. This angle of "intersection" results in the cross-over point 606 having a minimal area in which there is a "stacked" void of conductive material in the substrate. It will be appreciated that cross-over points where the "intersections" of the split lines are made at angles greater than ninety degrees would generally increase the area of the cross-over point and may lead to less than optimal results in reducing delaminations in the substrate along the split lines. Although the width of the split lines may vary widely, in one embodiment, reduced delaminations in the laminated substrate are obtained using the present invention when using a split line width in the range of 0.15-mm to 0.10-mm with near ninety degree "intersection" of the split lines at the cross-over point, i.e., an "intersection" area in the range of the 0.0225-mm$^2$ to 0.01-mm$^2$.

In other embodiments, the split lines may be offset from each other so that the split lines have very little to no "intersections". In these embodiments, the split lines may be so offset that the individual segments of the different layers are no longer substantially aligned in the substrate. This may result in a segment of one layer overlapping one or more segments in overlying or underlying layers that support differently powered circuitry. This overlap may result in increased noise and/or degraded package performance. Thus, it is preferred that the split lines be offset and patterned as earlier described, but not to such a degree that the referenced segments in the different layers begin to overlap and package performance to degrade.

Thus, there has been described a substrate for use in an integrated circuit package in which the substrate includes a plurality of split power and/or ground plane layers that are isolated by split lines. The split lines form at least two split power plane segments that are offset relative to one another. This serves to reduce the probability of delaminations of the substrate. In a preferred embodiment of the invention, the split lines are arranged to minimize their respective cross-over points and may also be convoluted to increase the overall effective length of the split lines. Further, there has been described methods for forming split lines to reduce the probability of delamination.

It will be appreciated that while the above-embodiments of the present invention have been described in regard to integrated circuit packages and substrates, other embodiments of the present invention may include the various interim forms of multi-layered substrates, such as package panels.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. An integrated circuit package comprising:
   a substrate, said substrate further comprising a plurality of split conductive layers, wherein each of said split conductive layers is divided into segments that are electrically isolated by split lines;
   and further wherein said split lines from at least two of the split conductive layers are offset relative to one another, the offset split lines decreasing delamination in the substrate.

2. The integrated circuit package as recited in claim 1 wherein said split lines are offset relative to one another to reduce cross-over points.

3. An integrated circuit package comprising:
   a substrate, said substrate further comprising a plurality of split conductive layers, wherein each of said split conductive layers is divided into segments that are electrically isolated by split lines;

and further wherein said split lines from at least two of the split conductive layers are offset relative to one another to reduce cross-over points and wherein said split lines cross-over each other at an intersection of substantially ninety degrees to each other.

4. The integrated circuit package as recited in claim 1 further comprising:

a die, said die being conductively coupled to said substrate by wire bonds and attached to said substrate by an adhesive; and an encapsulant, said encapsulant covering at least a portion of said die and said wire bonds.

5. An integrated circuit package having a multi-layer substrate, the substrate comprising:

at least a first conductive layer, the first conductive layer being divided into at least two first segments by at least two first split lines, the first split lines electrically isolating the first segments, the first conductive layer overlying a second conductive layer and separated from the second conductive layer by at least an electrically insulating layer, and at least a second conductive layer, the second conductive layer being divided into at least two separate second segments by at least two second split lines, said second split lines electrically isolating said second segments, said second split lines being formed such that when the first conductive layer is aligned over the second conductive layer in the substrate, the first split lines are offset relative to the second split lines and each of said first segments substantially overlies a corresponding second segment.

6. The integrated circuit package as recited in claim 5 further comprising:

an integrated circuit die attached to said substrate by an adhesive and conductively coupled to said substrate by wire bonds; and an encapsulant covering at least a portion of said die and said wire bonds.

7. The integrated circuit package as recited in claim 5 wherein at least one of said first split lines are formed according to a first split line pattern and at least one of said second split lines are formed according to a second split line pattern, said second split line pattern being different from said first split line pattern so that cross-over points between said first and said second split line patterns are minimized.

8. An integrated circuit package having a multi-layer substrate, the substrate comprising:

at least a first conductive layer, the first conductive layer being divided into at least two first segments by at least two first split lines, the first split lines electrically isolating the first segments, the first conductive layer overlying a second conductive layer and separated from the second conductive layer by at least an electrically insulating layer, and at least a second conductive layer, the second conductive layer being divided into at least two separate second segments by at least two second split lines, said second split lines electrically isolating said second segments, said second split lines being formed such that when the first conductive layer is aligned over the second conductive layer in the substrate, the first split lines are offset relative to the second split lines and each of said first segments substantially overlies a corresponding second segment and wherein said first and second split lines are convoluted to increase the effective length of the first and second split lines.

9. An integrated circuit package having a multi-layer substrate, the substrate comprising:

at least a first conductive layer, the first conductive layer being divided into at least two first segments by at least two first split lines, the first split lines electrically isolating the first segments, the first conductive layer overlying a second conductive layer and separated from the second conductive layer by at least an electrically insulating layer, and at least a second conductive layer, the second conductive layer being divided into at least two separate second segments by at least two second split lines, said second split lines electrically isolating said second segments, said second split lines being formed such that when the first conductive layer is aligned over the second conductive layer in the substrate, the first split lines are offset relative to the second split lines and each of said first segments substantially overlies a corresponding second segment, at least one of said first split lines formed according to a first split line pattern and at least one of said second split lines formed according to a second split line pattern, said second split line pattern being different from said first split line pattern so that cross-over points between said first and said second split line patterns are minimized and said cross-over points between said first and said second split line patterns are made at substantially ninety degree angles.

* * * * *